(12) United States Patent
Deem et al.

(10) Patent No.: US 7,554,052 B2
(45) Date of Patent: Jun. 30, 2009

(54) METHOD AND APPARATUS FOR THE APPLICATION OF TWIN WIRE ARC SPRAY COATINGS

(75) Inventors: John Gilbert Deem, Chandler, AZ (US); Robert Manuel Coyne, Mesa, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 372 days.

(21) Appl. No.: 11/192,600

(22) Filed: Jul. 29, 2005

(65) Prior Publication Data

US 2007/0026159 A1 Feb. 1, 2007

(51) Int. Cl.
*C23C 26/00* (2006.01)
*B23K 9/04* (2006.01)
*B23K 9/00* (2006.01)

(52) U.S. Cl. .............................. 219/76.14; 219/121.47; 427/421.1; 427/402; 427/419.1

(58) Field of Classification Search ....................... None
See application file for complete search history.

(56) References Cited

U.S. PATENT DOCUMENTS

| | | | |
|---|---|---|---|
| 5,135,629 A | 8/1992 | Sawada et al. | |
| 6,398,125 B1 | 6/2002 | Liu et al. | |
| 6,465,052 B1 | 10/2002 | Wu | |
| 7,250,220 B1 * | 7/2007 | Rymer et al. | 428/469 |
| 2003/0116276 A1 | 6/2003 | Weldon et al. | |
| 2004/0099285 A1 | 5/2004 | Wang et al. | |
| 2005/0238807 A1 * | 10/2005 | Lin et al. | 427/248.1 |
| 2006/0105182 A1 * | 5/2006 | Brueckner et al. | 428/457 |
| 2006/0110620 A1 * | 5/2006 | Lin et al. | 428/650 |
| 2006/0292310 A1 * | 12/2006 | Le et al. | 427/446 |

FOREIGN PATENT DOCUMENTS

EP        1 508 629 A1        2/2005

OTHER PUBLICATIONS

THEIS Precision Steel Co. webpage on Surface Condition (http://www.theis-usa.com/t20.htm) Apr. 12, 2001.*
Web Archive page showing publication date of THEIR Precision Steel Co. webpage of Apr. 12, 2001 (http://web.archive.org/web/*/http://www.theis-usa.com/t20.htm).*
Communication enclosing the extended European search report of EP Application No. 06253692.5 dated Nov. 22, 2006.
European Search Report of Application No. EP 06 25 3692; Date of completion of the search: Nov. 10, 2006.

* cited by examiner

*Primary Examiner*—Jennifer McNeil
*Assistant Examiner*—Jason L Savage
(74) *Attorney, Agent, or Firm*—Blakely, Sokoloff, Taylor & Zafman LLP (57) ABSTRACT

Methods and apparatuses are disclosed for applying a twin wire arc spray composite coating to achieve surface effects on a substrate having predetermined characteristics.

8 Claims, 5 Drawing Sheets

TWAS-0.006-0.009

FIG. 2B
(PRIOR ART)

TWAS BACKLIGHT

FIG. 2C
(PRIOR ART)

TWAS(0.012")

FIG. 2D
(PRIOR ART)

TWAS BACKLIGHT

FIG. 3A
(PRIOR ART)

COMPOSITE TWAS (0.012")

FIG. 3B
(PRIOR ART)

COMPOSITE TWAS BACKLIGHT

METHOD AND APPARATUS FOR THE APPLICATION OF TWIN WIRE ARC SPRAY COATINGS

FIELD OF THE INVENTION

The present invention generally relates to the field of coating deposition. More specifically, the present invention is directed to methods and apparatuses for depositing coatings onto substrates using modified Twin Wire Spray Arc methodology.

BACKGROUND OF THE INVENTION

In the field of processing chamber deposition, chamber components and surfaces are often modified to facilitate optimum production of work pieces being coated. Deposition processes entail subjecting work piece surfaces to conditions and coatings requiring stringent quality control. Coating thicknesses for many work pieces, such as, for example, semiconductors, are extremely small, often as small as several thousandths of an inch or less. Various plasma coating technologies create byproducts in the deposition chamber that are vented from the chamber atmosphere during or after coating occurs. However, some plasma byproduct remains adhered to the inner surfaces, or walls, of the chamber as well as other chamber components exposed to the inner chamber environment. When byproduct builds up to a predetermined amount, usually based on hours of operation, the production must be brought off line, and the chamber surfaces replaced or cleaned to remove the byproduct build up. If this regular maintenance is not conducted, byproduct may separate from the chamber walls and other exposed components and contaminate the work pieces being coated. This contamination often results in work piece failure or malfunction. As a result, in the coating industry, chamber inner surfaces and chamber components exposed to the inner chamber have modified surfaces designed to increase the adherence of plasma and other coating process byproducts. This enhanced adherence of byproduct to the chamber walls and chamber components increases the processing time achieved between chamber cleanings, which, in turn, increases overall system productivity as the process remains "on line" longer resulting in greater overall product yield. In addition, if the by-product is particularly valuable or otherwise recyclable, by-product adherence to the chamber walls and components is also desired.

Attempts at modifying chamber component surfaces to achieve the proper surface characteristics to effect the desired byproduct adherence are known. However, it has been difficult creating adequate "roughness" on chamber surfaces to increase adhering coating process byproducts thereto.

The substrates of many chamber components are often made from aluminum-alloys or stainless steels. The outer surfaces of these components must then be treated to effect the desired surface features and microscopic contours. Known surface "roughing" techniques include grit blasting, or chemically etching metal surfaces. In addition, coatings have been applied to metal substrate surfaces to create irregular surfaces. These known methods have worked to roughen the metal substrate surfaces. However, all known methods have been somewhat unacceptable in terms of the finite degree of adherence with respect to the amount or volume of byproduct able to be "trapped" by the modified chamber wall surface In addition, the application of coatings to metal surfaces, introduces additional problems with respect to the nearly permanent adherence of the coating to the metal that must be realized. In other words, coatings applied to chamber wall surfaces that "roughen" the metallic chamber wall surface are not useful if the coatings themselves will eventually delaminate and contribute to the contamination of the work pieces. Known coatings designed to make metallic and non-metallic (e.g. ceramic) chamber walls less smooth must be deposited such that irregularities are presented to the finished surface. However, known methods have not only risked delamination, but have been deposited in a fashion that creates potential gaps that leave the substrate surface coated discontinuously. This results in plasma byproduct being able to react with the substrate surface, or otherwise work to accelerate the delamination of the coating from the chamber wall substrate, further exacerbating the chamber contamination issues and frustrating by-product recycling issues.

SUMMARY OF THE INVENTION

In one embodiment, the present invention is directed to a method for coating deposition chamber component substrate. A deposition chamber component substrate having a substrate surface is provided along with a twin wire arc spray coating apparatus for applying coatings. A composite coating is applied. The composite coating comprises a first twin wire arc spray coating that is applied on the substrate surface followed by a second twin wire arc spray coating applied on the first twin wire arc spray coating. Through regulating coating components, nozzle flow, and substrate composition, the coating surface displays predictable preselected characteristics, in particular a desired roughness for adhering chemical species. Most desirably, the surface roughness of the second coating is greater than the surface roughness of the first coating.

In a further embodiment, the present invention is directed to a method for immobilizing tantalum-containing compounds from a tantalum deposition process. A deposition chamber is provided, with the chamber comprising chamber components and a chamber inner surface. The chamber components and chamber inner surface further comprise a plasma composite coating, with the composite coating comprising first and second layers. A tantalum-containing compound is provided to a plasma coating process. The process releases tantalum species from the tantalum-containing compound, and deposits an amount of the tantalum species on a work piece. An amount of tantalum species contacts and adheres to the composite coating. The composite coating is then treated to release the tantalum species from the composite coating. An amount of the tantalum species is then reclaimed from the composite coating.

In yet another embodiment, the present invention is directed to a composite coating deposited onto a substrate surface, said coating comprising a first coating layer having a first roughness value and a second coating layer having a second roughness value greater than the first roughness value. The first and second coating layers comprise a metal selected from the group consisting of aluminum, aluminum alloy, nickel, and molybdenum.

In a still further embodiment, the present invention is directed to a processing chamber comprising a chamber having an inner chamber, said chamber having an inner surface and processing chamber components, said components having an outer surface. The chamber inner surface and component outer surfaces comprise a composite coating, having a first layer having a first roughness value and a second layer having a second roughness value greater than the first roughness value. The composite layer is deposited onto the chamber inner surface and component outer surfaces substantially continuously.

DETAILED DESCRIPTION OF THE INVENTION

Thermal spraying is a known material processing technique used in various high-tech industries. Twin Wire Arc Spraying (TWAS) processes are particularly useful thermal spraying processes. In the TWAS processes two wires are fed into respective contact tips that pass electrical current into the wires. The tips are oriented toward each other so the wires extend toward an intersection. A high current is applied across the wires causing an electrical arc to form across the tips of the wires. The electric current then melts the feed wire portion in the arc zone. A nozzle device is located proximate to and between the contact tips and is oriented to emit a gas stream toward the arc zone. The gas stream sprays the molten metal onto the work surface forming a coating.

Figure 1:
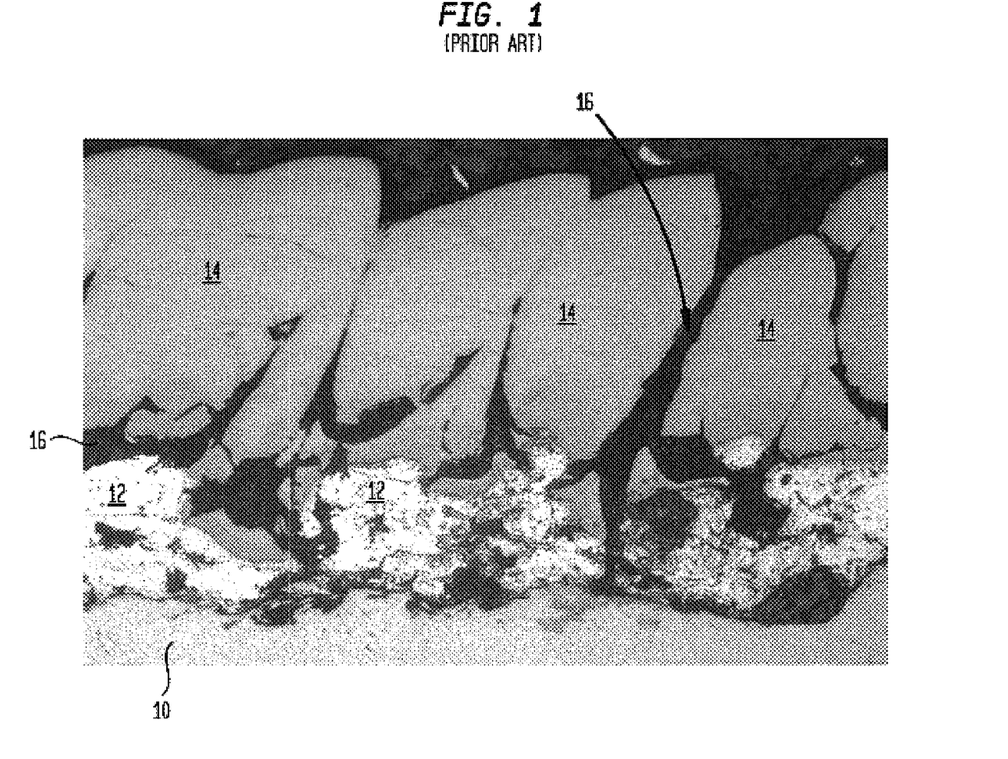
FIG. 1 is an enlarged cross-sectional photograph of metal substrates coated with known TWAS technologies (Prior Art).

TWAS processes have been used to treat deposition chamber component surfaces. However, such processes have not yielded optimum results. Specifically, TWAS coatings have provided random coating to surfaces of substrates used in deposition chambers. As shown in FIG. 1 (prior art), a thin, non-continuous TWAS coating layer 12 was deposited on a substrate 10 used in a deposition chamber for semiconductor processing. The coated substrate was then exposed to work piece processing conditions including the release of tantalum and tantalum nitride vapor within the deposition chamber for deposition onto the work pieces, specifically semiconductor wafers. A coating of tantalum particles 14 is shown adhered to the TWAS coating layer 12. FIG. 1 clearly shows the non-continuous nature of the TWAS coating such that potential gaps are created 16, potentially allowing tantalum species to attack substrate 10.

Figure 2A:
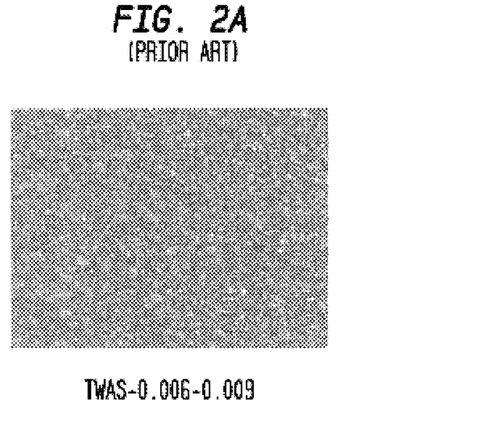
FIGS. 2a-2d are photographs showing TWAS-coated quartz samples. (Prior Art).
Figure 2B:
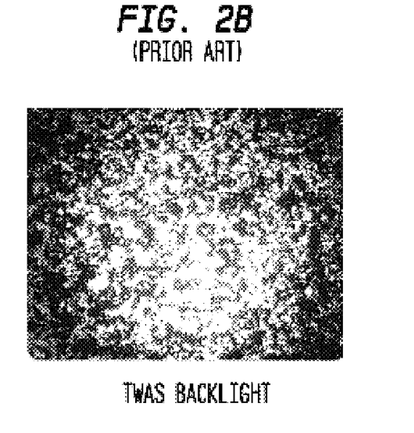
Figure 2C:
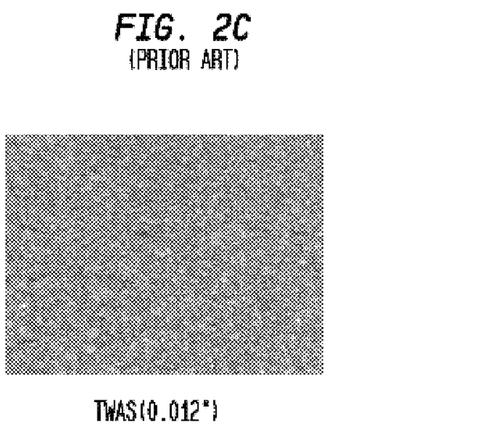
Figure 2D:
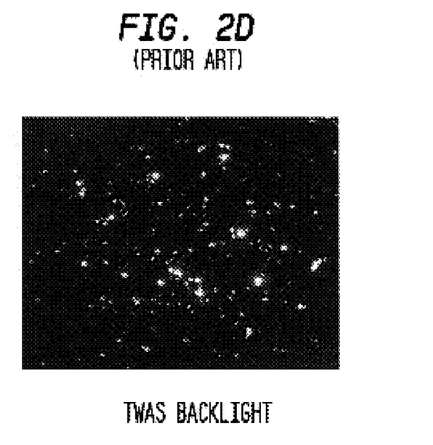

FIGS. 2a-2d show a plan overhead view of aluminum TWAS-coated quartz substrates. FIGS. 2a and 2c show two aluminum TWAS-coated substrates 20, 22, respectively, under ordinary light. FIG. 2b shows the substrate 20 of FIG. 2a under backlit conditions showing light penetration though the substrate, evidencing the incomplete and non-continuous coating effected by the TWAS process. Similarly, FIG. 2d shows the substrate of FIG. 2c under backlit conditions showing light penetration though the substrate, evidencing the incomplete and non-continuous coating effected by the TWAS process.

Figure 3A:
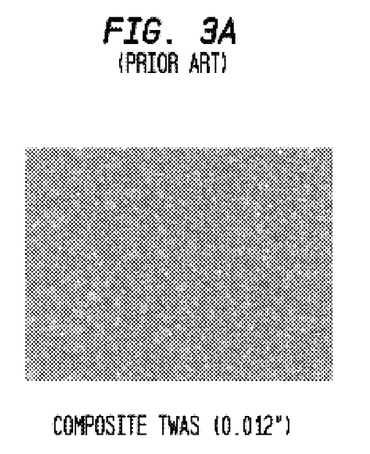
FIGS. 3a-3b—are photographs of quartz samples coated according to one embodiment of the processes of the present invention.
Figure 3B:
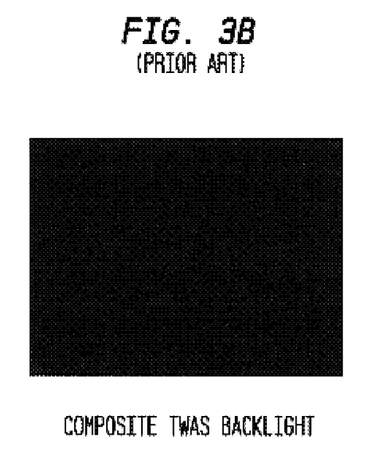

By contrast, FIGS. 3a and 3b show quartz substrate 30 coated by the TWAS processes of the present invention, whereby the TWAS-coated quartz substrate 30 is shown under natural light (FIG. 3a) and under backlit conditions (FIG. 3b). In this example, the substrate 30 shown in FIG. 3b shows no light penetration, evidencing a continuous aluminum TWAS coating. According to one preferred embodiment of the present invention, the TWAS coating was deposited as a composite coating, in that, a bond coat and a top coat of aluminum were deposited.

Figure 4:
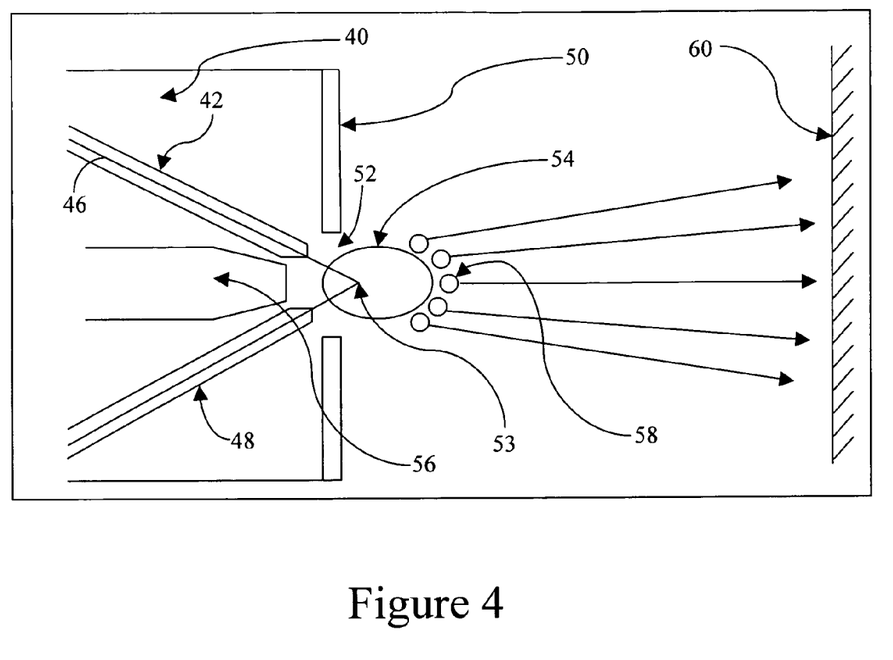
FIG. 4 is a schematic representation of the twin wire arc spray assembly of one embodiment of the present invention.

FIG. 4 shows a schematic representation of one embodiment of the TWAS system of the present invention. The depicted system shows a TWAS gun body 40 comprising wire sleeve contact tips 42, 44 housing consumable wire 46, 48 respectively. Gun nozzle 50 comprises aperture 52 through which wires 46, 48 extend to converge at an area 53 in the arc zone 54. A gas component nozzle 56 provides control to release of a compressed gas such as, for example, air, nitrogen, argon, etc. The energy provided to the system heats the wires, creates an arc zone and creates molten metal particles 58 that are directed with velocity in the direction of the straight arrows toward a substrate surface 60.

Figure 5:
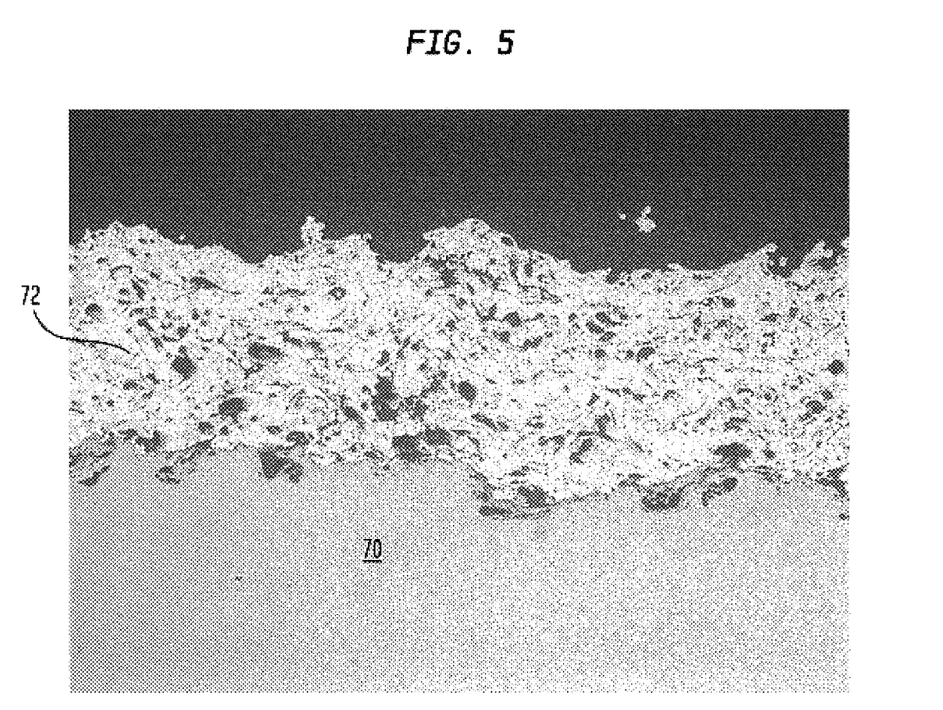
FIG. 5 is an enlarged cross-sectional photograph of a metal substrate coated with a TWAS system of the present invention.

FIG. 5 shows an enlarged cross-sectional photograph of the coated substrate of the present invention obtained by one embodiment of the present invention. As shown in FIG. 5 a thin continuous TWAS coating layer 72 was deposited on a substrate 70. Even though the coating was deposited in a two-step process, first depositing a bond coat to the substrate, followed in quick succession by a top coat applied to the bond coat, the coating is deposited more uniformly than conventional TWAS methods, resulting in a highly desirable, continuous coating with no perceptible gaps occurring in the coating that could allow penetration of tantalum to the substrate metal surface. In strong contrast to known TWAS coating methods, the TWAS composite coating methods of the present invention produce a substantially continuous coating on the substrate surface.

Aluminum is the most common material currently used for coatings on deposition chamber components, regardless of substrate. This is due at least in part to the knowledge that the aluminum metal of the chamber components, in use prior to the introduction of textured applied coatings, does not adversely affect the thin films being deposited due to secondary sputtering, ion mobility, etc. Other materials may be chosen for the coatings to allow selective stripping of the coatings without damage to the substrates. Examples of this can include many species, such as a common nickel/aluminum alloy or molybdenum coatings for aluminum substrates. The coatings mainly adhere to the substrates by mechanical bonds, such that many choices for bond coat/top coat combinations would work mechanically but must be studied for possible effects on the processes involved.

One embodiment of the present invention is directed to a process by which mechanical bond strength is greatly increased while maintaining desired surface roughness through the application of at least two layers. The first layer or "bond coat" is applied using a nozzle assembly that produces high velocity molten particles that conform very well to the pre-roughened surface of the substrate and to previously deposited metal splats. "Splats" is the technical term, referring to the shape of the solidified metal after contacting the substrate and solidifying). While this coating leads to very good adhesion to the substrate, it possesses a fairly smooth surface roughness (Ra) that is not optimized for collecting the deposition process residues. In one embodiment of the present invention, the bond coat is applied to have a surface roughness (Ra µm) of from about 10 to about 20 microns, more preferably from about 10 to about 18 microns.

The "top coat" is then sprayed onto the bond coat using a nozzle assembly that produces much lower velocity molten particles. These lower velocity particles do not flatten to the same extent that the high velocity particles do, and so yield a higher porosity coating as well as one with a much higher surface roughness. In one embodiment of the present invention, the surface roughness of the top coat is from about 15 to about 30 microns, more preferably from about 17 to about 23 microns. The same results may be obtained by varying the propellant gas flow rate, but for this embodiment the nozzle diameter was manipulated. According to the present invention, the roughness of the bond coat and top coats may vary, but for purposes of constructing the composite which comprises the two coats, the bond coat will have a roughness value that is less than the roughness of the top coat.

As stated above, in a physical vapor deposition (PVD) coating process for semiconductors tantalum species are directed to a work piece substrate for precision coating. However, tantalum and tantalum nitride species that are not effectively deposited onto the work piece substrate surface are either vented from the chamber atmosphere or adhere to the inner surface or the chamber and exposed chamber components. The tantalum species that adhere to the chamber inner surfaces assume a dendritic crystal formation. It is this tantalum species formation or "build up" that necessitates an enhanced surface area on the inner surface of the deposition chamber. Therefore, the processes used to "roughen" the inner surface, are, in fact, increasing surface area for the purpose of increasing the volume of attachment sites for entrapping and retaining stray unreacted or unvented particle species in the deposition chamber.

The known TWAS coating processes, when applied to the stainless steel or aluminum-containing inner surfaces of the processing chamber were applied in single applications. It was believed that too thick of a coating, or the application of multiple coatings, would be disadvantageous and itself lead to chamber contamination due to delamination. However, it has been discovered that the standard TWAS coatings can be microscopically discontinuous (See FIG. 1) to a degree sufficient to allow deposition chamber byproduct species, such as tantalum and tantalum nitride to diffuse past the TWAS coating layer o the chamber components to the base substrate, causing unacceptable delamination.

According to the present invention, a composite TWAS coating is applied to deposition chamber components that provides high roughness while maintaining coating continuity and effective diffusion barriers. The term "composite" refers to the presence of two separate layers being deposited, with each layer potentially having varying characteristics to obtain the desired overall coating characteristics.

In one embodiment, the spray distance from gun tip to substrate surface was about three to about 5 inches (from about 76 to about 127 mm), and preferably four inches (about 100 mm). The turn table speed is about 150 rpm with an applied current of about 125 amps. The air pressure supplied was about 60 psi. The spray gun had a nozzle diameter set for the bond coat (first coat on the substrate surface) of about 7.85 mm, and a nozzle diameter set for the top coat (second coat applied in the process, this coat applied to the bond coat) of about 22.5 mm. The metal applied was supplied to the TWAS process as aluminum wire having a diameter of about 1.59 mm. The TWAS process applied a wire feed rate of about 69 mm/second for each of two wires supplied. The coating thicknesses applied were from about 0.10 to about 0.15 mm for the bond coat and from about 0.15 mm to about 0.20 mm for the top coat. The combined preferred coating thickness is from about 254 to about 356 microns.

Indeed, according to one embodiment of the present invention, the overall thickness of the composite TWAS coatings (bond coat plus top coat) obtained was comparable to the known TWAS coating thicknesses used that fail to offer adequate protection against delamination due to by-product species diffusion. See Table 1.

TABLE 1

|  | Ra (μm) | Rz (mm) | Thickness (mm) | Bond Strength (mPa) |
|---|---|---|---|---|
| Current TWAS | 27 | 0.132 | 0.305 | 30 |
| Composite TWAS | 25 | 0.124 | 0.305 | 72 |

As shown in Table 1, while the coating thickness of the TWAS coatings of the present invention are comparable to the conventional TWAS coatings, the bond strength of the TWAS composite coating to the chamber substrate was improved greatly. In addition, the surface roughness was comparable to conventional coatings. According to the present invention, the desired bond strengths attainable are preferably in the range of from about 40 mPa to about 77 mPa.

Ra and Rz values are measured using a profilometer, a device that can measure deflections a stylus makes as it is drawn across a surface. The arithmetic average roughness (Ra) is defined as the arithmetic average height of roughness component irregularities from the mean line measured within the sample length (L). This measurement conforms to ANSI/ASME B46.1 "Surface Texture—Surface Roughness, Waviness and Lay". Ra (formerly known as AA or Arithmetic Average in the U.S., and CLA Centerline Average in the U.K.) is usually expressed in microinches (μin), and performed by moving a stylus or profilometer in a straight line along the surface. A consistent and measurable surface finish can be specified for a desired roughness of, for example, from about 12 to about 30 microns. Rz is the sum of the height of the highest peak plus the lowest valley depth within a sampling length.

EXAMPLES

Additional features, advantages and details of the present invention are included in the following description of exemplary embodiments of the invention, which description must be taken in conjunction with the accompanying drawings.

Example 1

Pull testing (tensile) was performed under ASTM C 633-01 *Standard Test Method for Adhesion or Cohesion Strength of Thermal Spray Coatings*. The samples were aluminum (Al), stainless steel (SST) or alumina ceramic coupons, as defined in the tables below.

Final Ra: 500>Ra>700 microinches

| Group #1 - Al TWAS on SST Tensile Tests | | | | |
|---|---|---|---|---|
| # | SAMPLE ID | LBS. | PSI | FAILURE MODE |
| 1 | 1-1 | 8514 | 10846 | 100% Adhesive |
| 2 | 1-2 | 8204 | 10451 | 100% Adhesive |
| 3 | 1-3 | 8628 | 10991 | 100% Adhesive |
| 4 | 1-4 | 8469 | 10789 | 100% Adhesive |
| 5 | 1-5 | 8187 | 10429 | 100% Adhesive |
| 6 | 1-6 | 8239 | 10496 | 100% Adhesive |
| 7 | 1-7 | 8214 | 10464 | 100% Adhesive |
| 8 | 1-8 | 8225 | 10478 | 100% Adhesive |
| AVERAGE FAILURE → | | 8335 | 10618 | |

Final Ra: 700>Ra>800 microinches

Group #2 - TWAS 2-1 - 2-8 Tensile Tests

| # | SAMPLE ID | LBS. | PSI | FAILURE MODE |
|---|---|---|---|---|
| 1 | 2-1 | 8648 | 11017 | 100% Adhesive |
| 2 | 2-2 | 8543 | 10883 | 100% Adhesive |
| 3 | 2-3 | 8241 | 10498 | 100% Adhesive |
| 4 | 2-4 | 8259 | 10521 | 100% Adhesive |
| 5 | 2-5 | 8192 | 10436 | 100% Adhesive |
| 6 | 2-6 | 8340 | 10624 | 100% Adhesive |
| 7 | 2-7 | 8740 | 11134 | 100% Adhesive |
| 8 | 2-8 | 8319 | 10597 | 100% Adhesive |
| | AVERAGE FAILURE → | 8410 | 10714 | |

Example 2

Pull testing (tensile) was performed under ASTM C 633-51 *Standard Test Method for Adhesion or Cohesion Strength of Thermal Spray Coatings*. The samples were aluminum (Al), stainless steel (SST) or alumina ceramic coupons, as defined in the tables below.

Final Ra: 700<Ra<900 microinches

TWAS/SST - Tensile Tests

| # | SAMPLE ID | LBS. | PSI | FAILURE MODE |
|---|---|---|---|---|
| 1 | 3-1 | 8619 | 10980 | 100% Adhesive |
| 2 | 3-2 | 8264 | 10527 | 100% Adhesive |
| 3 | 3-3 | 8460 | 10777 | 100% Adhesive |
| 4 | 3-4 | 8262 | 10525 | 100% Adhesive |
| 5 | 3-5 | 7968 | 10150 | 100% Adhesive |
| 6 | 3-6 | 8004 | 10196 | 100% Adhesive |
| 7 | 3-7 | 8221 | 10473 | 100% Adhesive |
| 8 | 3-8 | 8032 | 10232 | 100% Adhesive |
| | AVERAGE FAILURE → | 8229 | 10483 | |

Final Ra: 1000<Ra<1200 microinches

TWAS/SST - Tensile Tests

| # | SAMPLE ID | LBS. | PSI | FAILURE MODE |
|---|---|---|---|---|
| 1 | SS-1 | 6555 | 8350 | 80% Coating Break-Middle/20% Adhesive |
| 2 | SS-2 | 6233 | 7940 | 70% Coating Break-Middle/30% Adhesive |
| 3 | SS-3 | 6263 | 7978 | 60% Coating Break-Middle/40% Adhesive |
| 4 | SS-4 | 6810 | 8675 | 70% Coating Break-Middle/30% Adhesive |
| 5 | SS-5 | 5994 | 7636 | 90% Coating Break-Middle/10% Adhesive |
| 6 | SS-6 | 5963 | 7596 | 75% Coating Break-Middle/25% Adhesive |
| 7 | SS-7 | 6227 | 7932 | 60% Coating Break-Middle/40% Adhesive |
| 8 | SS-8 | 5892 | 7506 | 75% Coating Break-Middle/25% Adhesive |
| | AVERAGE FAILURE → | 6242 | 7952 | |

Example 3

Pull testing (tensile) was performed under ASTM C 633-01 *Standard Test Method for Adhesion or Cohesion Strength of Thermal Spray Coatings*. The samples were aluminum (Al), stainless steel (SST) or alumina ceramic coupons, as defined in the tables below.

TWAS/Al - Tensile Tests

| # | SAMPLE ID | LBS. | PSI | FAILURE MODE |
|---|---|---|---|---|
| 1 | Al-1 | 5845 | 7446 | 70% Coating Break-Middle/30% Adhesive |
| 2 | Al-2 | 5531 | 7046 | 70% Coating Break-Middle/30% Adhesive |
| 3 | Al-3 | 6037 | 7690 | 60% Coating Break-Middle/40% Adhesive |
| 4 | Al-4 | 6793 | 8654 | 70% Coating Break-Middle/30% Adhesive |
| 5 | Al-5 | 6356 | 8097 | 70% Coating Break-Middle/30% Adhesive |
| 6 | Al-6 | 6866 | 8746 | 80% Coating Break-Middle/20% Adhesive |
| 7 | Al-7 | 6729 | 8572 | 60% Coating Break-Middle/40% Adhesive |
| 8 | Al-8 | 6327 | 8060 | 70% Coating Break-Middle/30% Adhesive |
| | AVERAGE FAILURE → | 6311 | 8039 | |

All aluminum coupons used in the testing, the results of which are set forth in Examples 1-3 were made from 6061 aluminum alloy. The stainless steel coupons used were made from 304 L stainless steel.

Example 4

Tests were conducted to determine the adhesion of aluminum TWAS to alumina ceramic. This was achieved using a bond coat applied by a plasma spray process with the substrate pre-heated to between a temperature ranging from about 700° F. to about 900° F.

It is believed that the pre-heating is needed because the key sites on the blasted ceramic surface are much smaller than those created when you grit blast metal substrates. The increased substrate temperature allows the molten aluminum to cool more slowly on contact, and so allows it to flow into the smaller key sites before it solidifies.

Plasma/TWAS on Ceramic Tests

| # | SAMPLE ID | LBS. | PSI | FAILURE MODE |
|---|---|---|---|---|
| 1 | Specimen ID #1 | 5029 | 6406 | 100% Interface |
| 2 | Specimen ID #2 | 3971 | 5059 | 100% Substrate ceramic substrate broke |
| 3 | Specimen ID #3 | 6480 | 8255 | 100% Interface |
| 4 | Specimen ID #4 | 5804 | 7394 | 100% Interface |
| 5 | Specimen ID #5 | 6182 | 7875 | 100% Interface |
| 6 | Specimen ID #6 | 4936 | 6288 | 100% Substrate ceramic substrate broke |
| 7 | Specimen ID #7 | 5856 | 7460 | 100% Interface |
| 8 | Specimen ID #8 | 5771 | 7352 | 100% Interface |
| 9 | Specimen ID #9 | 5836 | 7434 | 100% Interface |
| 10 | Specimen ID #10 | 4867 | 6200 | 100% Interface |
| | AVERAGE FAILURE → | 5473 | 6972 | |

The present invention facilitates enhanced recovery of species adhered to the improved substrate coating of the present invention. Since the coatings of the present invention have enhanced "roughness", or have a greater volume of binding sites on the surface, an increased volume of species being coated, such as, for example, tantalum may adhere and grow in crystalline formations. This facilitates an increase in tantalum recovery and recycling during chamber cleaning. This recovery and recycling enhances the overall efficiency of the system compared to known processes. More specifically, with respect to tantalum, aluminum occurring on the chamber walls between the substrate and the deposited tantalum is dissolved using a solution of potassium hydroxide. The tantalum and stainless steel are insoluble in this solution such that the substrate is not destroyed during the recovery and recycling phases of the process. The tantalum is then recovered from the chamber and reclaimed once this stripping cycle is complete. The recovered tantalum is desirably in a nearly pure form.

Although the various aspects of the present invention have been described with respect to specific examples and embodiments thereof, it will be understood that the invention is entitled to protection within the full scope of the appended claims.

We claim:

1. A method for coating a processing chamber component substrate surface comprising the steps of:
   providing a processing chamber component substrate having a substrate surface;
   providing a twin wire arc spray coating apparatus for applying coatings; and
   applying a composite twin wire arc spray coating to the substrate surface, said composite twin wire arc spray coating comprising a first bond coating having an average surface roughness value from about 10 to about 20 microns on the substrate surface, and a second top coating having an average surface roughness value from about 17 to about 23 microns on the first bond coating, such that the second top coating has an average surface roughness value that is greater than the first bond coating average surface roughness value.

2. The method of claim 1, wherein the substrate surface is made from a material comprising a metallic substrate.

3. The method of claim 2, wherein the metallic substrate comprises a metal selected from the group consisting of stainless steel-containing alloys, aluminum and aluminum-containing alloys.

4. The method of claim 1, wherein the substrate surface is made from a material comprising a non-metallic substrate.

5. The method of claim 4, wherein the non-metallic substrate comprises a ceramic-containing compound.

6. The method of claim 1, wherein the composite twin wire arc spray coating comprises a metal selected from the group consisting of aluminum, nickel, aluminum alloys and molybdenum.

7. The method of claim 1, wherein the composite twin wire arc spray coating provides a substantially continuous coating to the substrate surface.

8. The method of claim 1, wherein the composite twin wire arc spray coating has a bond strength of from about 40 mPa to about 77 mPa.

* * * * *